United States Patent
Wu et al.

(10) Patent No.: US 8,080,448 B1
(45) Date of Patent: Dec. 20, 2011

(54) SEMICONDUCTOR DEVICE WITH NESTED ROWS OF CONTACTS

(75) Inventors: Ping Wu, Tianjin (CN); Qingchun He, Tianjin (CN); Peng Liu, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/092,170

(22) Filed: Apr. 22, 2011

(30) Foreign Application Priority Data

Aug. 11, 2010 (CN) .......................... 2010 1 0255738

(51) Int. Cl.
*H01L 21/00* (2006.01)
(52) U.S. Cl. . 438/123; 438/106; 438/127; 257/E21.499; 257/E21.502
(58) Field of Classification Search .................. 438/63; 257/E21.5, E21.501
See application file for complete search history.

(56) References Cited

U.S. PATENT DOCUMENTS

| | | |
|---|---|---|
| 2008/0194081 A1 | 8/2008 | Arshad et al. |
| 2009/0188359 A1 | 7/2009 | Arshad et al. |
| 2011/0115061 A1* | 5/2011 | Krishnan et al. ............. 257/676 |

* cited by examiner

*Primary Examiner* — Cheung Lee
(74) *Attorney, Agent, or Firm* — Charles Bergere

(57) ABSTRACT

A method of making semiconductor devices includes producing an array of first lead frames having rows of first electrical contact elements on respective sides. Sub-assemblies are produced by applying a first molding compound peripherally to provide support between the first electrical contact elements of each of the first lead frames, and singulating the sub-assemblies. An array of assemblies is produced, each of which includes a second lead frame having rows of second electrical contact elements on respective sides, a respective one of the sub-assemblies disposed in the second lead frame with the rows of first electrical contact elements nested adjacent to and inside the rows of second electrical contact elements, and a semiconductor die mounted on the sub-assembly. The assemblies are encapsulated using a second molding compound with the rows of first and second electrical contact elements exposed on adjacent sides of an active face of the respective assembly.

14 Claims, 4 Drawing Sheets

SECTION A-A

TOP VIEW

BOTTOM VIEW

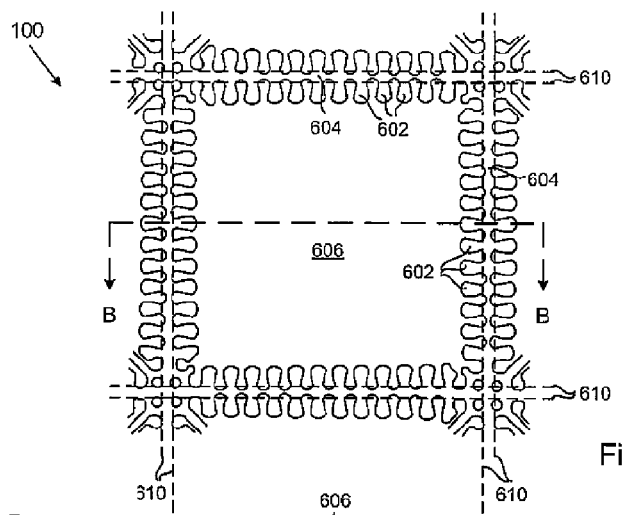
Fig. 6
Fig. 7
SECTION B-B
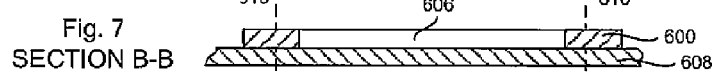
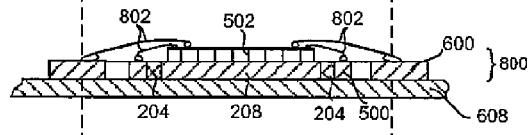
Fig. 8
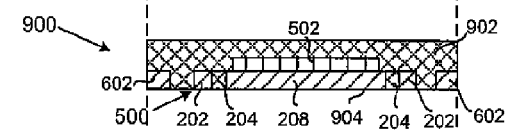
Fig. 9
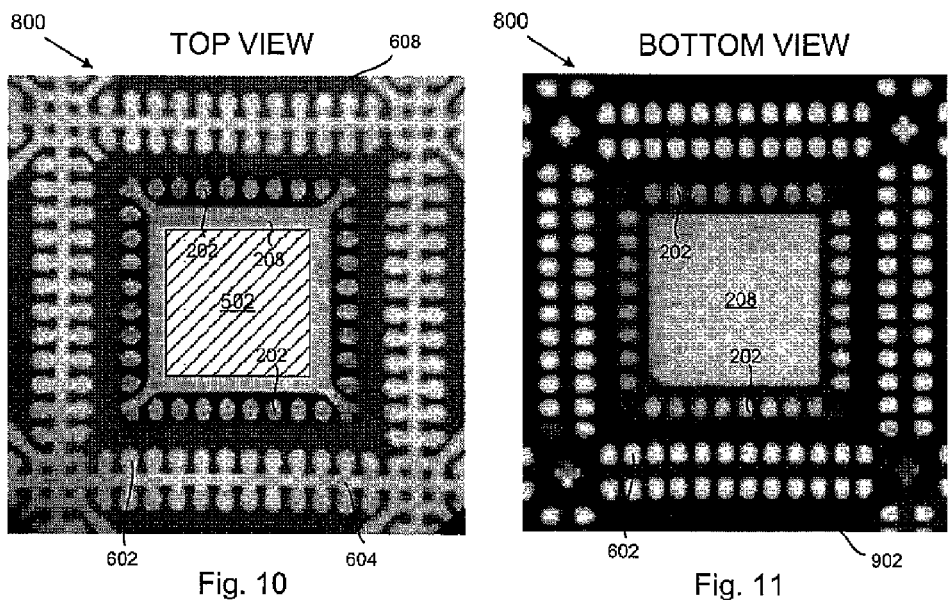
Fig. 10    Fig. 11

SEMICONDUCTOR DEVICE WITH NESTED ROWS OF CONTACTS

BACKGROUND OF THE INVENTION

The present invention is directed to semiconductor devices with nested rows of contacts and to a method of making such semiconductor devices.

Semiconductor devices, such as integrated circuits, comprise a semiconductor die (or chip) in a package with exposed electrical contact surfaces. The completed devices may be mounted on a support with electrical connections, such as a printed circuit board (PCB), for example. Using surface mount technology the electrical contact surfaces of the package can be soldered directly to corresponding pads on the support, providing mechanical attachment as well as electrical connections.

A completed surface mount device typically includes an electrically insulating molding material that covers the semiconductor die such that the device presents a top face and a bottom, active face, which are generally rectangular or square, and transversely extending edges. The molding compound may encapsulate the semiconductor die completely, or may define an air cavity that is then sealed with a ceramic or plastic lid. Typically, the device has a pair of sets of electrical contact surfaces on opposite sides of the device ('dual in-line package') or two orthogonal pairs of sets of electrical leads on respective sides of the device ('quad package').

In one type of package, the electrical contact surfaces are positioned in the bottom active face of the device. Each set of electrical contact surfaces includes discrete elements disposed side by side at intervals in rows in the active face of the device for soldering to the electrical connections of the support. In order to increase the number of contact surfaces available, more than one row of electrical contact surfaces may be provided in each set on the respective side of the device. The adjacent rows at each respective side of the device are nested, extending parallel to each other and to the adjacent side of the device, one row being further from the adjacent side of the device than the other row is.

The semiconductor die may be mounted in the device on a pad or flag of the same material as the electrical contact surfaces, which is usually a metal, such as copper, which may be plated. The die pad may be exposed at the bottom face of the device, to assist cooling the die, known as an exposed-pad package. Alternatively, the die pad may be omitted, known as a non-exposed pad package. In a non-exposed pad package the die may be mounted on the discrete electrical contact elements. In each case, the die and electrical contact elements and any die pad are held together mechanically by the encapsulating molding material. The electrical contact elements of the device may be connected electrically to electrical contact pads on the die itself by bonded wires, of gold, copper or aluminum for example, accommodating differential thermal expansion of the die and the package materials.

A prevalent technique used in manufacturing such a surface mount device includes forming an array of lead frames in a strip or sheet of electrically conductive material, usually metal, by etching and/or stamping for example. Each lead frame comprises a frame structure common to adjacent lead frames and supporting in the array the sets of discrete electrical contact portions which will form the sets of electrical contacts of the completed device after singulation and any die pad for mounting the die. The array of lead frames could comprise a single strip but typically comprises a two-dimensional array, with the supporting frame structure of the complete array comprising surrounding bars on the outer edges of the array and intersecting intermediate bars common to adjacent lead frames.

In a typical surface mount semiconductor device packaging process using lead frames, the semiconductor dies are mounted on and connected electrically to respective ones of the lead frames. The encapsulation material is then molded over and around the lead frame strip or sheet, possibly with a lid in the case of an air cavity package, so as to encapsulate the integrated circuit dies, the electrical contact surface elements and the bonded connection wires of each of the lead frames. The individual devices are then separated by a singulation process, in which the lead frame strip or sheet is cut apart. The singulation may be a saw operation. If desired, saw singulation enables the molding compound to be applied over the entire array, being cut subsequently during the singulation process. During saw singulation, a saw blade is advanced along 'saw streets' which extend between the electrical contact surface elements of adjacent lead frames, so as to cut off the supporting frame structures of the lead frames from the electrical contact surface portions of the lead frames and separate the individual devices from each other.

A high level of quality control of production process, including the singulation process, is desirable.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

FIG. 6 is a plan view of a second lead frame used in a method of making semiconductor devices in accordance with an embodiment of the present invention;

FIG. 7 is a section along the line B-B of FIG. 6 of the second lead frame after a taping stage;

FIG. 8 is a section of an assembly including the sub-assembly of FIG. 5 in the second lead frame of FIG. 7;

FIG. 9 is a section of the assembly of FIG. 8 after molding, de-taping and singulation;

FIG. 10 is a top view of the assembly of FIG. 8;

FIG. 11 is a bottom view of the assembly of FIG. 8 after molding and de-taping but before singulation.

DETAILED DESCRIPTION OF PREFERRED EMBODIMENTS OF THE INVENTION

In one embodiment, the present invention provides a method of making semiconductor devices. The method includes providing an array of first lead frames, each of which comprises a plurality of rows of first electrical contact elements on respective sides thereof, applying a first molding compound to said array of first lead frames to provide support between said first electrical contact elements of each of said first lead frames, and singulating said first lead frames to produce a plurality of sub-assemblies. A plurality of second lead frames each of which comprises a plurality of rows of second electrical contact elements on respective sides thereof also is provided. Respective ones of said sub-assemblies are placed inside ones of said second lead frames such that the rows of first electrical contact elements are nested adjacent to and inside said rows of second electrical contact elements. A semiconductor die is attached on said respective ones of said sub-assemblies and then pads on the die are electrically connected to said first and second electrical contact elements of the respective first and second lead frames, thereby forming a plurality of assemblies. The assemblies are then encapsulated with a second molding compound, wherein said rows of first and second electrical contact elements are exposed on adjacent sides of an active face of the respective semiconductor device. Finally the assemblies are singulated.

In another embodiment, the present invention provides a semiconductor device including a first lead frame having on respective sides thereof a plurality of rows of first electrical contact elements and a first molding compound that provides support between said first electrical contact elements. The first lead frame and said first mold compound form a sub-assembly. The device also has a second lead frame including on respective sides thereof a plurality of rows of second electrical contact elements. The said sub-assembly is disposed between said rows of second electrical contact elements with said rows of first electrical contact elements nested adjacent to and inside said rows of second electrical contact elements. A semiconductor die is mounted on said sub-assembly, electrical connections are made between said semiconductor die and said first and second electrical contact elements; and a second molding compound is disposed on said rows of first and second electrical contact elements, wherein said first and second electrical contact elements present exposed electrical contact surfaces on adjacent sides of an active face of the semiconductor die.

Figure 1:
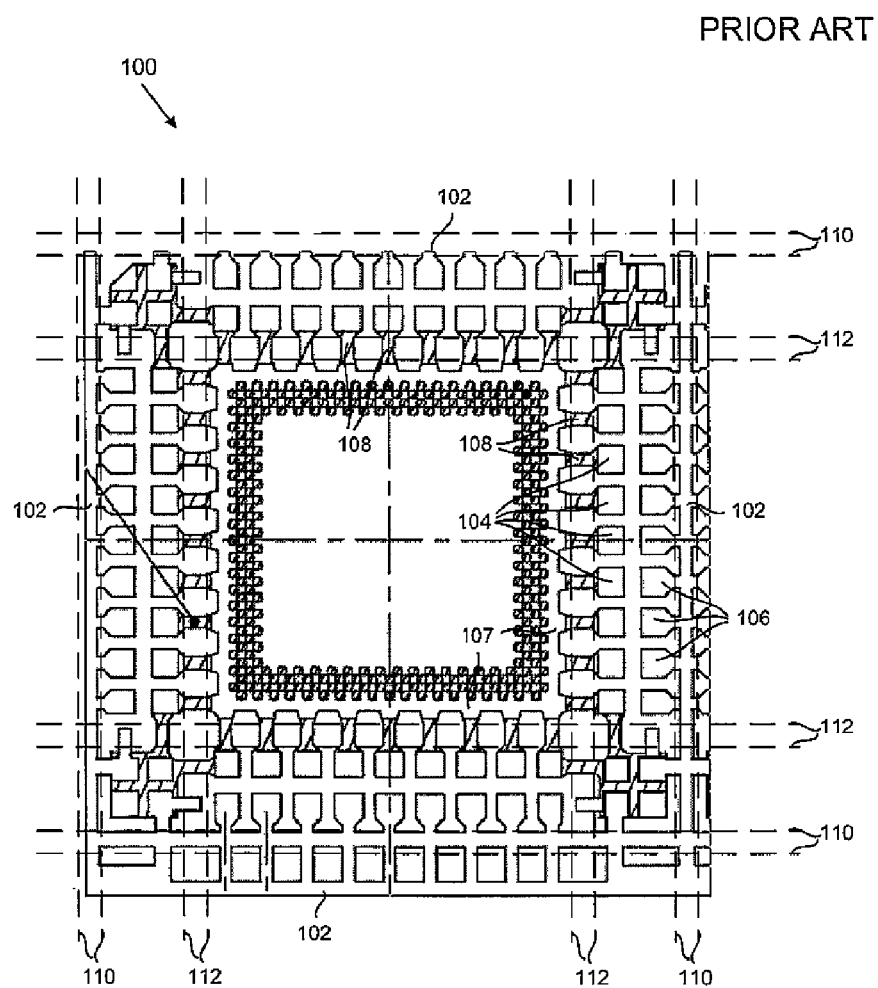
FIG. 1 is a top view of a conventional lead frame.

FIG. 1 shows a single lead frame 100 in a two-dimensional array of lead frames used in a known method of making quad package semiconductor devices. The lead frame 100 comprises a rectangular (in this case square) frame structure 102 surrounding the lead frame 100. Adjacent to each side of the device, the lead frame 100 includes a first row of electrical contact elements 104 and a second row of electrical contact elements 106. The first row of electrical contact elements 104 is an inner row, positioned further from the adjacent side of the device than the second row, which is an outer row. The electrical contact elements 104 of the first, inner row are initially supported by an inner structure 107, which may be part of a die pad, by the intermediary of connection bars 108. The electrical contact elements 106 of the second, outer row are directly supported by the frame structure 102. The connection bars 108 and the frame structure 102 connect the electrical contact elements 104 and 106 electrically as well as mechanically. These electrical connections of the electrical contact elements 104 and 106 must be cut once the electrical contact elements 104 and 106 are supported by further structure of the device, notably molding compound. The frame structure 102 may be cut during normal saw singulation of the devices, after molding and de-taping, by sawing along saw streets 110 and the molding compound in the saw street is cut at the same time. However, when cutting the connection bars 108 along saw streets 112, the saw must cut from the bottom active face of the device only through the metal of the lead frame and penetrate as little as possible the molding compound. Otherwise, if the molding compound were cut through as well as the metal, the inner structure of the device, including the electrical contact elements 104 of the first, inner row (and any die pad), would be separated from the outer structure of the device, including the electrical contact elements 106 of the second, outer row and the frame structure 102.

Sawing part way through the thickness of a device during manufacture in this way is difficult to control to a sufficient high level of quality specification.

FIGS. 2 to 12 illustrate a method of making semiconductor devices, and a semiconductor device, in accordance with an example of an embodiment of the present invention. In this example, a method of making semiconductor devices comprises producing an array of first lead frames 200 having rows of first electrical contact elements 202 on respective sides. Production of sub-assemblies 500 includes applying a first molding compound 204 to the array of first lead frames to provide support between the first electrical contact elements 202 of each of the first lead frames 200, and singulating the sub-assemblies 500. An array of assemblies 800 is produced, each of which includes a second lead frame 600 having rows of second electrical contact elements 602 on respective sides, a respective one of the sub-assemblies 500 disposed with the rows of first electrical contact elements nested adjacent to and inside the rows of second electrical contact elements, and a semiconductor die 502 mounted on the sub-assembly 500. The semiconductor dies 502 are connected electrically to the first and second electrical contact elements 202 and 602. The assemblies 800 are encapsulated using a second molding compound 902 with the rows of first and second electrical contact elements 202 and 602 exposed adjacent sides of an active face 904 of the respective semiconductor device 900, and the assemblies 800 are singulated. An example of this method is summarized in a flow chart in FIG. 12.

FIGS. 2 to 11 illustrate by way of example a method of producing a quad package device having first and second rows of electrical contact elements at each of the four sides of the device. It will be appreciated that the method can be adapted to producing an in-line package with first and second rows of electrical contact elements at only two opposite sides of the device. FIGS. 2 to 11 illustrate by way of example a method of producing an exposed die pad semiconductor device. It will be appreciated that the method can be adapted to producing a non-exposed die pad semiconductor device.

Figure 2:
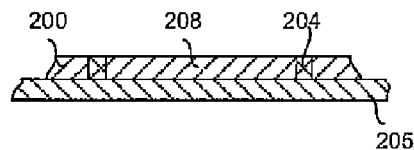
FIG. 2 is a section along the line A-A of FIG. 4 of a first lead frame at a stage after molding in a method of making semiconductor devices in accordance with one embodiment of the present invention.
Figure 3:
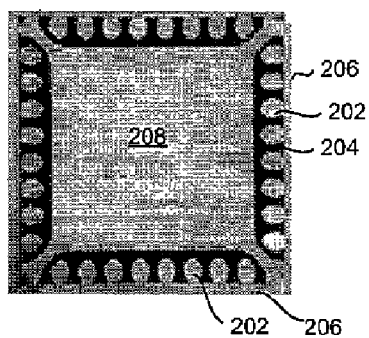
FIG. 3 is a top view of the first lead frame shown in FIG. 2 after de-taping.
Figure 4:
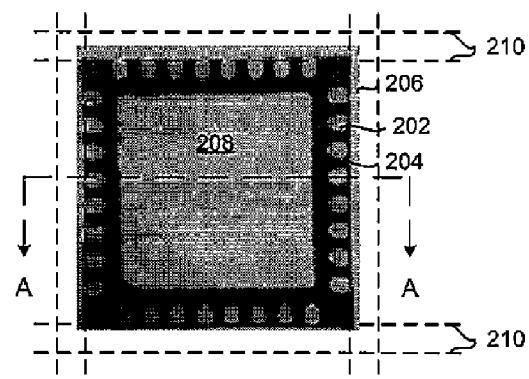
FIG. 4 is a bottom view of the first lead frame shown in FIG. 3.

In more detail, FIGS. 2 to 4 show a single lead frame of a two-dimensional array of first lead frames 200 formed by stamping and/or etching, for example. Each of the first lead frames 200 comprises two orthogonal pairs of rows of first electrical contact elements 202, the rows being disposed on respective sides of the first lead frame. As seen in FIGS. 3 and 4, in the array of first lead frames 200, the contact elements 202 are supported by orthogonal bars 206 which are common to adjacent lead frames of the array of first lead frames and which form a supporting frame structure surrounding the contact elements 202 of each of the first lead frames. Each of the first lead frames 200 comprises a respective die pad 208, disposed between the rows of first electrical contact elements 202 and the bars 206, and on which the semiconductor die 502 will be mounted, the die pad 208 also being supported by corner connections 208 connecting the die pad 208 to the bars 206 in the lead frame array.

Figure 5:
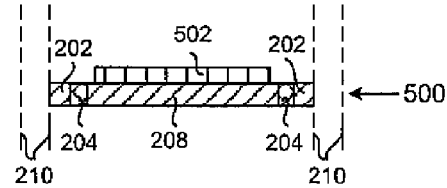
FIG. 5 is a section of a sub-assembly including the first lead frame shown in FIGS. 3 and 4 and a semiconductor die bonded on the first lead frame.

When the lead frames 200 are singulated to form the sub-assemblies 500, the bars 206 will be cut away. In order to support and hold together the first electrical contact elements 202 and the die pad 208 during subsequent operations, molding compound is applied selectively between the first electrical contact elements 202, and between the first electrical contact elements and the die pad 208, forming a first molding compound 204, so that the sub-assemblies 500 can be manipulated. However, the first molding compound 204 extends only peripherally around each sub-assembly 500 and does not cover the die pad 208, so that the semiconductor die 502 can be mounted subsequently on the die pad 208 and electrical connections can be made subsequently to the semiconductor die 502. As shown in FIG. 2, the array of lead frames 200 is mounted on a first sheet of adhesive tape 205 and the first molding compound 204 is applied and cured. The tape 205 is then removed, the array of lead frames 200 then appearing as seen in the top and bottom views of FIGS. 3 and 4. The sub-assemblies 500 are then singulated by sawing along saw streets 210 in row and column directions, as illustrated at 210 in FIGS. 4 and 5. One of the resulting sub-assemblies 500 is shown in FIG. 5. The array 200 of lead frames has the corner connections 208 etched partly through their thickness from the underside, so that in the sub-assemblies 500 the first molding compound 204 penetrates under the corner connections 208 to support the die pads after singulation, as seen in FIGS. 3 and 4.

In this example of an embodiment of the invention, the semiconductor dies 502 are mounted on the sub-assemblies 500 by bonding to the die pad 208 after singulation of the sub-assemblies, as shown in FIG. 5, but before incorporating the sub-assemblies 500 in the assemblies 800 (FIG. 8). It will be appreciated that otherwise the semiconductor dies 502 can be mounted on the sub-assemblies 500 before singulation of the sub-assemblies. Alternatively, the semiconductor dies 502 can be mounted on the sub-assemblies 500 after their incorporation in the assemblies 800. If no die pads such as 502 are provided in the sub-assemblies 500, the semiconductor dies 502 can be mounted on the first electrical contact elements 202, for example.

FIG. 6 shows a single lead frame of a two-dimensional array of second lead frames 600 formed by stamping and/or etching, for example. Each of the second lead frames 600 comprises two orthogonal pairs of rows of second electrical contact elements 602 on respective sides of the second lead frame. The contact elements 602 are supported by orthogonal bars 604 which are common to adjacent lead frames of the array of second lead frames and which form a rectangular (in this example square) supporting frame surrounding the contact elements 602. The second lead frames 600 do not have die pads, and each of the second lead frames 600 presents a central aperture 606 between the rows of second electrical contact elements 602. The aperture 606 is wider than the sub-assembly 500, so that the sub-assembly can fit in the aperture 606 inside the second lead frames 600 between the rows of second electrical contact elements 602 with sufficient clearance between the first and second electrical contact elements 202 and 602.

In the next step, the array of second lead frames 600 is mounted on a second sheet of adhesive tape 608, as shown in FIGS. 7 and 8. An array of assemblies 800 is then produced by mounting the sub-assemblies 500 on the adhesive tape 608 in the apertures 606 of respective ones of the second lead frames 600. In this example of an embodiment of the invention, the semiconductor dies 502 are mounted on the sub-assemblies 500 before the sub-assemblies 500 are mounted in the second lead frames 600 but alternatively, the semiconductor dies 502 can be mounted on the sub-assemblies 500 afterwards. FIG. 10 is a top view of an assembly 800 mounted on the adhesive tape 608 at this stage of the process.

In each assembly 800, the rows of first electrical contact elements 202 are nested adjacent to and inside the rows of second electrical contact elements 602. In the example illustrated of a quad package, each of the first lead frames comprises two orthogonal pairs of rows of first electrical contact elements on respective sides of the first lead frame and each of the second lead frames comprises two orthogonal pairs of rows of second electrical contact elements on respective sides of the second lead frame, the assembly 800 having first and second rows of electrical contact elements 202 and 602 at each of the four sides of the assembly. In the case of an in-line package, each of the first lead frames comprises a single pair of rows of first electrical contact elements on respective sides of the first lead frame and each of the second lead frames comprises a single pair of rows of second electrical contact elements on respective sides of the second lead frame, the assembly 800 having first and second rows of electrical contact elements 202 and 602 aligned at each of two opposite sides of the assembly.

Each of the semiconductor dies 502 is then connected electrically to the first and second electrical contact elements 202 and 602 of the corresponding assembly. In this example, the electrical connections are established using individual wires 802 each bonded to a pad on the semiconductor dies 502 and an electrical contact element 202 or 602, as shown in FIG. 8.

In the next step, the assemblies 800 are encapsulated using a molding compound to form a second molding compound 902. Encapsulating the assemblies includes applying the second molding compound 902 to the sub-assemblies 500 and the second lead frames on the second sheet of adhesive tape 608. The second sheet of adhesive tape 608 is then removed. FIG. 11 is a bottom view of an encapsulated assembly 800 at this stage of the process.

The encapsulated assemblies 800 are then singulated by sawing along column and row saw streets indicated by dashed lines 610 to produce the semiconductor devices 900. The orthogonal supporting bars 604 are separated from the rows of second electrical contact elements 602 and removed by the singulation process. The molding compound 902 leaves the rows of first and second electrical contact elements 202 and 602 exposed adjacent sides of an active face 904 of the respective semiconductor device 900.

Each of the resulting semiconductor devices 900 comprises a sub-assembly 500 including on respective sides thereof a plurality of rows of first electrical contact elements 202 from a first lead frame 200, and a first molding compound 204 providing support between the first electrical contact elements. The semiconductor device 900 also comprises an assembly 800 including on respective sides thereof a plurality of rows of second electrical contact elements 602 from a second lead frame 600, the sub-assembly 500 disposed between the rows of second electrical contact elements with the rows of first electrical contact elements 202 nested adjacent to and inside the rows of second electrical contact elements 602, a semiconductor die 502 mounted on the sub-assembly 500, and electrical connections 802 between the semiconductor die and the first and second electrical contact elements. The assembly 800 is encapsulated using a second molding compound 902 with the rows of first and second electrical contact elements 202 and 602 presenting electrical contact surfaces exposed adjacent sides of an active face 904 of the semiconductor device.

Figure 12:
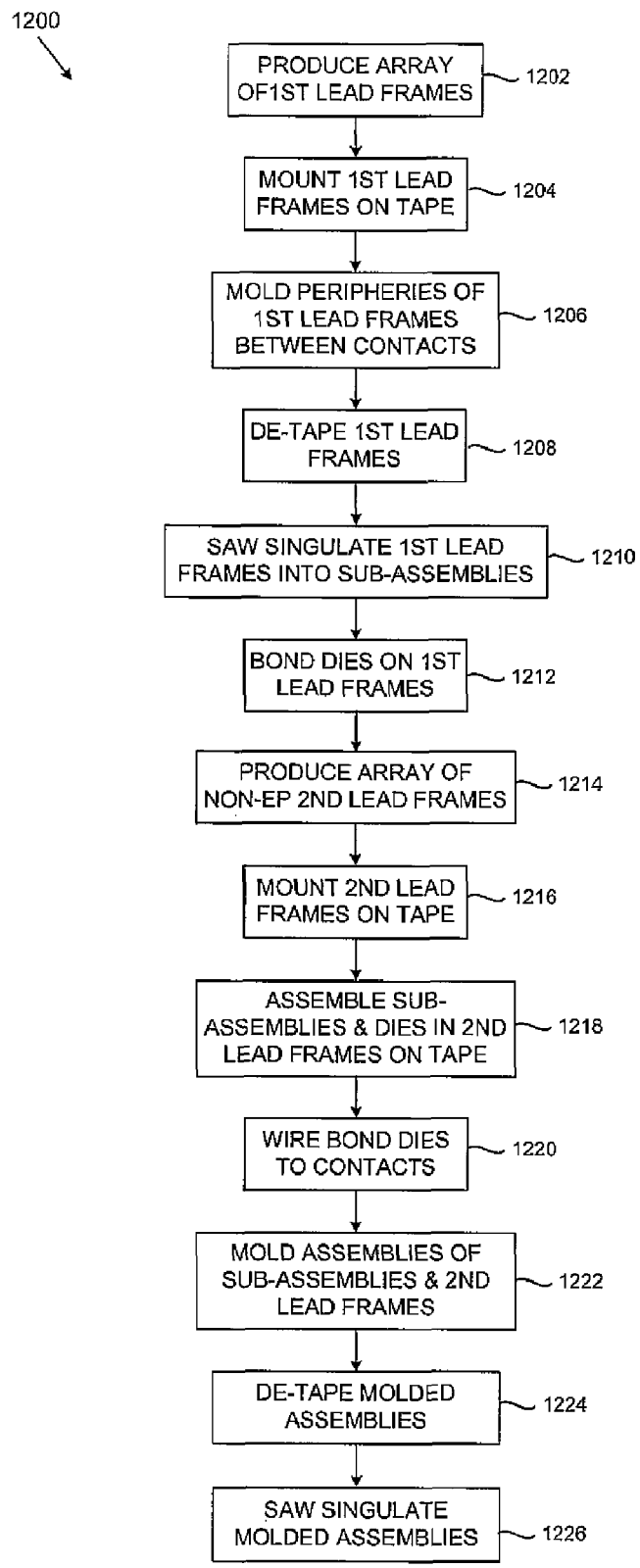
FIG. 12 is a flow chart of a method of making semiconductor devices illustrated in FIGS. 2 to 11.

FIG. 12 is a flow chart of a method 1200 of making semiconductor devices, as described above with reference to FIGS. 2 to 11. The method 1200 starts at 1202 by producing an array of first lead frames 200 having rows of first electrical contact elements 202 on respective sides. At 1204, the array of first lead frames 200 is mounted on a first sheet of adhesive tape. Sub-assemblies 500 are produced at 1206 by applying a first molding compound 204 peripherally of each first lead frame 200 to provide support between the first electrical contact elements 202 of each of the first lead frames 200. The first sheet of tape is then removed from the array of first lead frames 200 at 1208, and the sub-assemblies 500 are saw singulated at 1210. At 1212 semiconductor dies 502 are bonded on each of the sub-assemblies 500.

An array of assemblies 800 is then produced. Producing the assemblies 800 includes at 1214 producing an array of non-exposed die pad second lead frames 600 each having rows of second electrical contact elements 602 on respective sides. At 1216, the array of second lead frames 600 is mounted on a second sheet of adhesive tape 608 and, at 1218, a respective one of the sub-assemblies 500 is disposed in each second lead frame 600 with the rows of first electrical contact elements 202 nested adjacent to and inside the rows of second electrical contact elements 602, and a semiconductor die 502 is mounted on the sub-assembly 500.

At 1220, the semiconductor dies 502 are connected electrically to the first and second electrical contact elements 202 and 602 by wire bonding. The assemblies 800 are then encapsulated at 1222 using a second molding compound 902. At 1224, the adhesive tape 608 is removed from the encapsulated assemblies 800 are the assemblies 800 are then saw singulated at 1226.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor device described herein can comprise any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit within a single complete package of the semiconductor device. Alternatively, the examples may be implemented as more than one separate integrated circuits or separate devices interconnected with each other in a suitable manner within a single complete package of the semiconductor device However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A method of making semiconductor devices, comprising:

providing an array of first lead frames, each of which comprises a plurality of rows of first electrical contact elements on respective sides thereof;

applying a first molding compound to said array of first lead frames to provide support between said first electrical contact elements of each of said first lead frames, and singulating said first lead frames to produce a plurality of sub-assemblies;

providing a plurality of second lead frames each of which comprises a plurality of rows of second electrical contact elements on respective sides thereof, placing a respective one of said sub-assemblies inside one of said second lead frames, wherein said rows of first electrical contact elements are nested adjacent to and inside said rows of second electrical contact elements, and attaching a semiconductor die on said respective ones of said sub-assemblies;

connecting each of said semiconductor dies electrically to said first and second electrical contact elements of the respective first and second lead frames, thereby forming a plurality of assemblies;

encapsulating said assemblies using a second molding compound, wherein said rows of first and second electrical contact elements are exposed on adjacent sides of an active face of the respective semiconductor device; and singulating said assemblies.

2. The method of making semiconductor devices of claim 1, wherein each of said first lead frames comprises a respective die pad disposed between said rows of first electrical contact elements, wherein said semiconductor dies are mounted on said die pads.

3. The method of making semiconductor devices of claim 2, wherein encapsulating said assemblies leaves said die pads exposed in said active faces of the respective semiconductor devices.

4. The method of making semiconductor devices of claim 2, wherein producing said sub-assemblies includes applying said first molding compound to provide support for said die pads as well as for said first electrical contact elements of said first lead frames.

5. The method of making semiconductor devices of claim 1, wherein said semiconductor dies are mounted on said sub-assemblies respectively before said sub-assemblies are disposed in said assemblies.

6. The method of making semiconductor devices of claim 1, wherein producing said sub-assemblies includes mounting said array of first lead frames on a first adhesive tape, applying said first molding compound to said first lead frames on said adhesive tape, and removing said first adhesive tape before singulating said first lead frames.

7. The method of making semiconductor devices of claim 1, wherein each of said second lead frames presents an aperture between said rows of second electrical contact elements, and forming said array of assemblies includes mounting an array of said second lead frames on a second adhesive tape, and mounting said sub-assemblies on said second adhesive tape in said apertures of respective ones of said second lead frames.

8. The method of making semiconductor devices of claim 7, wherein encapsulating said assemblies includes applying said second molding compound to said sub-assemblies and said second lead frames on said second adhesive tape, wherein said second adhesive tape is removed before singulating said assemblies.

9. The method of making semiconductor devices of claim 1, wherein each of said first lead frames comprises two orthogonal pairs of rows of first electrical contact elements on respective sides of the first lead frame and each of said second lead frames comprises two orthogonal pairs of rows of second electrical contact elements on respective sides of the second lead frame, said semiconductor devices forming quad packages.

10. A semiconductor device, comprising:
a first lead frame including on respective sides thereof a plurality of rows of first electrical contact elements;
a first molding compound that provides support between said first electrical contact elements, wherein said first lead frame and said first molding compound form a sub-assembly;
a second lead frame including on respective sides thereof a plurality of rows of second electrical contact elements, wherein said sub-assembly is disposed between said rows of second electrical contact elements with said rows of first electrical contact elements nested adjacent to and inside said rows of second electrical contact elements;
a semiconductor die mounted on said sub-assembly;
electrical connections between said semiconductor die and said first and second electrical contact elements; and
a second molding compound disposed on said rows of first and second electrical contact elements, wherein said first and second electrical contact elements present exposed electrical contact surfaces on adjacent sides of an active face of the semiconductor die.

11. The semiconductor device of claim 10, wherein said first lead frame includes a die pad disposed between said rows of first electrical contact elements, wherein said semiconductor die is mounted on said die pad.

12. The semiconductor device of claim 11, wherein said second molding compound leaves said die pad exposed in said active face of the semiconductor device.

13. The semiconductor device of claim 11, wherein said first molding compound of said sub-assembly provides support for said die pad as well as for said first electrical contact elements.

14. The semiconductor device of claim 10, wherein the first lead frame includes two orthogonal pairs of rows of said first electrical contact elements on respective sides of the semiconductor die and said second lead frame includes two orthogonal pairs of rows of second electrical contact elements on respective sides of the semiconductor die, wherein said semiconductor device is a quad package.

* * * * *